United States Patent [19]

Groten

[11] Patent Number: 5,588,017
[45] Date of Patent: Dec. 24, 1996

[54] OPTOELECTRONIC SEMICONDUCTOR DEVICE, SYSTEM FOR OPTICAL GLASS FIBRE COMMUNICATION HAVING SUCH A DEVICE, SEMICONDUCTOR DIODE LASER FOR USE IN SUCH A DEVICE, AND METHOD OF MANUFACTURING SUCH A DEVICE

[75] Inventor: Maurice Groten, Eindhoven, Netherlands

[73] Assignee: U.S. Philips Corporation, New York, N.Y.

[21] Appl. No.: 446,977

[22] Filed: May 22, 1995

[30] Foreign Application Priority Data

May 24, 1994 [EP] European Pat. Off. .............. 94201450

[51] Int. Cl.⁶ ................................. H01S 3/08; H01S 3/19
[52] U.S. Cl. ............................................. 372/49; 372/109
[58] Field of Search .............................. 372/109, 49, 50

[56] References Cited

U.S. PATENT DOCUMENTS

| | | | |
|---|---|---|---|
| 5,031,188 | 7/1991 | Koch et al. | 372/50 |
| 5,285,468 | 2/1994 | Ackerman et al. | 372/96 |
| 5,404,242 | 4/1995 | Chawki et al. | 372/49 X |

FOREIGN PATENT DOCUMENTS 0053742  6/1982  European Pat. Off. .

OTHER PUBLICATIONS

"Optical Modules Permit Interactive Communication, Serve in Multimedia Systems" by Makoto Haneda, Hitachi Ltd. JEE Apr. 1994, pp. 66–69.

Primary Examiner—James W. Davie
Attorney, Agent, or Firm—Steven R. Biren

[57] ABSTRACT

An optoelectronic semiconductor device (100) includes a laser (10) which emits a first radiation beam (80) with a first wavelength ($\lambda_1$) at one side (50) and which forms a radiation waveguide (3) for a second radiation beam (90) with a second wavelength ($\lambda_2$) greater than the first wavelength ($\lambda_1$), which second beam can enter the laser (10) at said side (50), and a photodiode (20) present at the other side (60) of the laser (10), aligned with the laser (10), and sensitive to radiation of the second wavelength ($\lambda_2$). The laser (10) and the photodiode (20) are discrete components which are present in series along a single, straight radiation path, and the device (100) is provided with means (51, 61, 71) whereby during use the major portion of the emission of the laser (10) is formed by the first radiation beam (80), substantially exclusively the first radiation beam (80) issues from the first side (50) of the laser (10), and substantially the entire second radiation beam (90) is capable of reaching the photodiode (20). Such a device is simple and easy to manufacture, while it can nevertheless be satisfactorily used in a glass fibre communication system. The individual components are simple and comparatively inexpensive. The means preferably include a first coating (51) on the one side (50) of the laser (10), having a low reflection at both wavelengths, and two further, multilayer coatings (61, 71) situated at the other side (60) of the laser (10), on this laser and on the photodiode (20), respectively, and having a high reflection at the first wavelength and a low reflection at the second wavelength.

19 Claims, 2 Drawing Sheets

5,588,017

OPTOELECTRONIC SEMICONDUCTOR DEVICE, SYSTEM FOR OPTICAL GLASS FIBRE COMMUNICATION HAVING SUCH A DEVICE, SEMICONDUCTOR DIODE LASER FOR USE IN SUCH A DEVICE, AND METHOD OF MANUFACTURING SUCH A DEVICE

BACKGROUND OF THE INVENTION

The invention relates to an optoelectronic semiconductor device—often referred to as device hereinafter for short—comprising a semiconductor diode laser—often referred to as laser hereinafter for short—which at a first side thereof emits a first radiation beam with a first wavelength and which forms a radiation waveguide for a second radiation beam with a second wavelength greater than the first wavelength, which second beam can enter the laser at the first side, and a semiconductor photodiode—often referred to as photodiode hereinafter for short—which is present at a second side of the laser opposed to the first side, which is aligned relative to the laser, and which is sensitive to radiation of the second wavelength. The invention also relates to a system for optical glass fibre communication comprising such a device, to a semiconductor diode laser suitable for use in such a device, and to a method of manufacturing such a device.

Such a device is used inter alia as a transmitter/receiver unit at a subscriber who exchanges information via a glass fibre communication network with a central unit or with another subscriber or group of subscribers who are in possession of such a transmitter/receiver unit. The exchanged information may comprise images, sound, and data, such as in the case of telephony, (subscriber) TV, etc., and takes place by means of two kinds of radiation of different wavelengths: radiation with a first wavelength ($\lambda_1$) for information supplied by the subscriber, and radiation with a second wavelength ($\lambda_2$) for information to be received by the subscriber or group of subscribers. The transmitter/receiver unit, accordingly, must detect optical signals with the second wavelength and convert them into (conventional) electrical signals, and convert other (conventional) electrical signals into optical radiation signals with the first wavelength.

Such a device is known from U.S. Pat. No. 5,031,188. An optoelectronic semiconductor device is shown therein, for example in FIG. 2 of cited patent, in which a semiconductor diode laser and a photodiode aligned therewith are present in a semiconductor body. The device emits a radiation beam with a wavelength of 1.3 μm at a first side and receives at this same side a radiation beam with a wavelength of 1.5 μm which passes through, in that order, a DFB (=Distributed FeedBack) diode laser which generates the first radiation beam, a monitor and absorption section which is insulated from the diode laser by means of a groove, and an electrical separation zone. Finally, the 1.5 μm radiation reaches a photodiode and is detected thereby. The conversion from electrical into optical signals and vice versa, mentioned above, is achieved by means of the electrical connections of the diode laser and the photodiode.

A disadvantage of the known device is that it is comparatively complicated: it comprises, as the above enumeration shows, comparatively many components which are indeed necessary for a good operation with little crosstalk and interference in the device. It will be clear that the manufacture of such a device is also fairly complicated and comprises many critical steps. This renders the known device comparatively expensive. This disadvantage is especially great because a glass fibre communication system in practice comprises very many such devices, even when one device is shared by a group of subscribers.

SUMMARY OF THE INVENTION

The present invention has for its object inter alia to provide an optoelectronic semiconductor device of the kind mentioned in the opening paragraph which does not have the above disadvantages, or at least to a much lesser degree, and which is thus comparatively simple and easy to manufacture, so that the price can be low. The invention accordingly also has for its object to enable a system for optical glass fibre communication which is comparatively inexpensive. In addition, the invention has for its object to realise a semiconductor diode laser which is suitable for use in the relevant device and to obtain a method of manufacturing such a device.

According to the invention, an optoelectronic semiconductor device of the kind mentioned in the opening paragraph is for this purpose characterized in that the laser and the semiconductor photodiode are discrete semiconductor components which are present in series along a single radiation path and are provided with means whereby during use the major portion of the laser emission is formed by the first radiation beam, substantially exclusively the first radiation beam issues from the first side of the laser, and substantially the entire second radiation beam is capable of reaching the photodiode. It is found that the device can be surprisingly simple thanks to the use of discrete components. The laser and photodiode may be simple standard components. Thus the laser may be of the comparatively simple Fabry-Pérot type. A complicated arrangement in the laser, such as a grating in the known device, may be omitted. In addition, the manufacture is simple because the components are arranged in a straight radiation path. The mutual alignment of the components is now comparatively simple. This becomes clear when we consider another known device which also uses discrete components, i.e. the device disclosed in "Optical Modules Permit Interactive Communication, Serve in Multimedia Systems", by M. Haneda, published in JEE, April 1994, pp. 66–69. This device (see e.g. FIG. 3 of the cited publication) has a so-called "rotating" construction. The radiation path from the fibre is split up into two branches in which the laser and the photodiode, respectively, are present. This renders the alignment comparatively complicated, and an additional, expensive component is necessary for splitting the radiation path. These two aspects render also this known solution comparatively expensive. Thanks to the presence of the means mentioned in the characterizing section, it is possible for the components to be included in a single radiation path, while nevertheless a good operation of the device with little noise and crosstalk is possible. The device has no or at least substantially no interference, or at most a highly acceptable level of interference in practical glass fibre communication systems, caused by crosstalk of Fresnel reflections or Rayleigh scattering-back of light signals from an optical glass fibre coupled to the device. Since the said means can be provided in a comparatively simple and easy manner, the device according to the invention is surprisingly inexpensive. An additional advantage is that the first radiation beam is generated with maximum efficiency.

In a first, very important embodiment, said means comprise a first coating which is present at the first side of the laser and which has a low reflection at both wavelengths, and a second coating which is present at the second side of the laser and which has a high reflection at the first wavelength and a low reflection at the second wavelength. This embodiment of the device achieves the above objects very well and is very easy to manufacture. The coatings may be provided in a simple manner, for example by sputtering or vapour deposition on a component, for example on mirror surfaces of the laser. In an important modification, the first coating is a single-layer coating and the second coating is a multilayer coating. It is possible with such multilayer coatings, which comprise alternating layers of low refractive index (for example n=approximately 1.5) and of high refractive index (for example n=approximately 3), to realise the properties required by the invention for radiation beams of various wavelengths. Such coatings may at the same time perform the function of a protective layer for, for example, the laser mirror surfaces.

In a preferred embodiment of a device according to the invention, the means comprise a third coating, preferably a multilayer coating like the second coating, which is present on the photodiode and which has properties similar to those of the second, multilayer coating. It is highly desirable for the reflection of the radiation generated by the laser to be very strong at the second side of the laser, for example, greater than or equal to 99%, while the transparency to the second radiation beam is also very great, for example, greater than or equal to 95%. This demands a multilayer coating with comparatively many layers. If the said requirements are to be fulfilled exclusively by the second multilayer coating, there will be comparatively many layers on the laser at the second side. Since a laser is a comparatively vulnerable device, this situation is not favourable. The (optical) properties of the second multilayer coating may fluctuate because a laser becomes (very) hot during operation, and in addition the coating may flake off the laser owing to the induced voltage. If part of the function of the means according to the invention at the second side of the laser is taken over by a third multilayer coating on the photodiode, the second coating can comprise fewer layers, and the problem of fluctuation and flaking-off becomes less. It should be borne in mind here that the photodiode does not or substantially not become hot during use. In addition, the provision of a coating on a photodiode ($n^2$ photodiodes simultaneously) is much simpler and more efficient than the provision of a coating on a laser (only n lasers simultaneously).

Preferably, the second and the third multilayer coating are substantially identical. Since one type of coating is used, i.e. a coating having the same layers, thicknesses, and compositions, the manufacture of a device according to the invention is comparatively simple. In a favourable modification, the photodiode is arranged at an angle of between approximately 10 and 30 degrees, and preferably approximately 20 degrees, relative to the radiation path, while the device also comprises a monitor diode which is sensitive to radiation of the first wavelength and which is aligned relative to radiation reflected by the photodiode. The laser output can be monitored and controlled thereby in a simple manner again with a discrete component.

In a very favourable embodiment, the first coating has a reflection of between 5 and 15%, for example approximately 10%, at the first wavelength and is low-reflecting or even anti-reflecting at the second wavelength, and the multilayer coatings present at the second side of the semiconductor diode laser together have a reflection of between approximately 99 and 100% at the first wavelength and are low-reflecting or anti-reflecting at the second wavelength. The expression "low-reflecting or anti-reflecting" is here understood to mean that the reflection is smaller than or equal to 5%. Such a device gives a highly satisfactory practical performance in a glass fibre communication network. Preferably, the multilayer coatings present at the second side of the semiconductor diode laser together have a reflection of at least 99.9%. Very good results are achieved when the latter reflection is approximately 99.99%. In the latter case, the crosstalk from the laser to the photodiode is at least 40 dB lower than the total laser power, which is typically from 0 to 5 dBm (=0 to 3.3 mW). If the device comprises a third multilayer coating on the photodiode in addition to the second multilayer coating on the laser, the second and third multilayer coatings each contribute to meeting the set requirements.

Preferably, the first wavelength lies between 1.28 μm and 1.34 μm, and the second wavelength lies between 1.48 μm and 1.60 μm. The first wavelength is then, for example, 1.30 μm and the second wavelength, for example, 1.55 μm. Such wavelengths are highly suitable for use in a glass fibre communication network, and the associated components made of the InP/InGaAsP material are very reliable. In a favourable embodiment of a device for the above wavelengths, the first coating present on the laser comprises one hafnium oxide layer with a thickness of 226 nm, and the second, multilayer coating comprises ten layers of silicon dioxide and silicon alternately, of which the first layer is 93.7 nm thick, the tenth layer 43.4 nm thick, and the second to ninth layers are 86.9 and 187.5 nm thick alternately. This corresponds to a reflection at the first side of the laser of 9.7% for the 1.3 μm radiation and 2.0% for the 1.5 μm radiation. At the rear of the laser, these values are 99.97% and 2.1%, respectively. No coating need be present on the photodiode in this case. As mentioned earlier, the device preferably comprises a second and a third multilayer coating. These coatings then each comprise, for example, eight layers, again alternating between silicon dioxide and silicon, of which the first layer is 93.7 nm thick, the eighth layer 43.4 nm thick, and the second to seventh layer are 86.9 and 187.5 nm thick alternately. The reflection on each multilayer coating is then 97.6% for the 1.3 μm radiation and 2.6% for the 1.5 μm radiation. The reflection of 97.6% of the second and third coatings corresponds to a total reflection of 98.8%, i.e. approximately 99%. When the photodiode is at an angle of, for example, 20° relative to the radiation path, it suffices to adapt the thicknesses of the eight layers of the third multilayer coating only: the first layer is then 96.4 nm thick, the eighth layer 43.7 nm thick, and the second to seventh layer are alternately 87.5 and 192.9 nm thick. The reflection on the third multilayer coating is then 93% for the 1.3 μm radiation and 3% for the 1.5 μm radiation. The total reflection of the second and third coatings is then approximately 98%.

Preferably, the device comprises a box-shaped body within which the components are present and which is provided with electrical connections for the component and with further means for coupling and uncoupling a glass fibre aligned with the laser at a side adjoining the first side of the laser. The box-shaped body may be a standard envelope such as a DIL (=Dual In Line) or so-called Butterfly envelope. Preferably, the box-shaped body comprises a coaxial sheath. Preferably, the sheath is provided with a standard glass fibre coupler. Such a preferred sheath also delivers a substantial contribution to a low cost price.

A system for optical glass fibre communication with an optoelectronic exchange and coupled thereto a glass fibre network which branches out and of which part of the ends is coupled to an optoelectronic transmitter/receiver unit which is present at a subscriber's, according to the invention, comprises an optoelectronic semiconductor device according to the invention as the transmitter/receiver unit. Such a system complies very well with the requirements set in practice and is also inexpensive.

The invention also relates to a laser which emits a radiation beam at a first side thereof with a first wavelength and which forms a radiation waveguide for a second radiation beam with a second wavelength greater than the first wavelength, while according to the invention the laser is provided with means whereby during use the major portion of the laser emission is formed by the first radiation beam, substantially exclusively the first radiation beam issues from the first side of the laser, and substantially the entire second radiation beam can pass the semiconductor diode laser without losses. Such a laser is highly suitable for use in an optoelectronic device according to the invention. Preferably, a first coating is present on a first mirror surface of the laser which has a low reflection at both wavelengths, while a second coating having a high reflection at the first wavelength and a low reflection at the second wavelength is present on a second mirror surface of the laser.

A method according to the invention for manufacturing an optoelectronic semiconductor device comprising a laser which emits a first radiation beam with a first wavelength at a first side and which forms a radiation waveguide for a second radiation beam with a second wavelength greater than the first wavelength and capable of entering the laser at the first side, and which comprises a photodiode present at a second side of the laser, aligned with the laser and sensitive to radiation with the second wavelength, is characterized according to the invention in that discrete semiconductor components are chosen for the laser and the photodiode and are arranged in a single, rectilinear radiation path one after the other in the device, and in that said semiconductor components are provided with means whereby during use the major portion of the laser emission is formed by the first radiation beam, substantially exclusively the first radiation beam issues from the first side of the laser, and the second radiation beam can reach the photodiode substantially entirely.

BRIEF DESCRIPTION OF THE DRAWING

The invention will now be explained in more detail with reference to several embodiments and the accompanying drawing, in which.

The figures are diagrammatic and not drawn to scale, the dimensions in the thickness direction being particularly exaggerated for the sake of clarity. Corresponding parts in the various Figures have been given the same reference numerals as much as possible.

DESCRIPTION OF THE PREFERRED EMBODIMENTS

Figure 1:
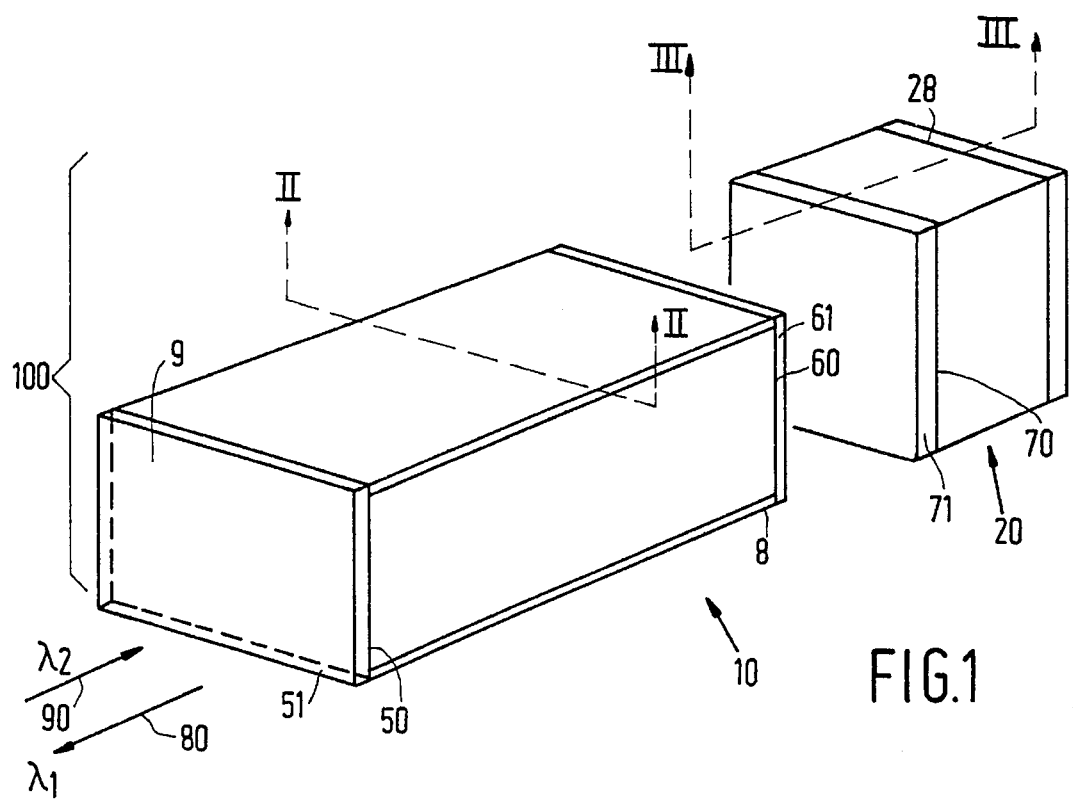
FIG. 1 diagrammatically shows an embodiment of an optoelectronic semiconductor device according to the invention in perspective view.
Figure 2:
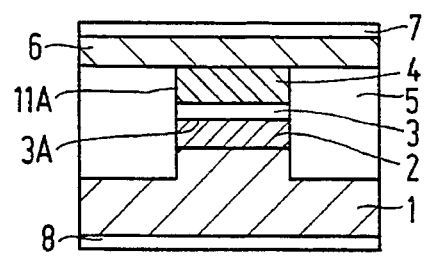
FIG. 2 diagrammatically shows the laser of the device of FIG. 1 in cross-section taken on the line II—II.
Figure 3:
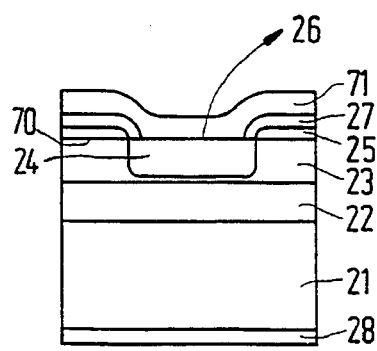
FIG. 3 diagrammatically shows the photodiode of the device of FIG. 1 in cross-section taken on the line III—III.

FIG. 1 diagrammatically and in perspective view shows an embodiment of a device 100 according to the invention with a laser 10 and a photodiode 20 which are mutually arranged in accordance with the invention in a single, substantially rectilinear radiation path and comprise discrete components. The radiation path extends in the direction of two radiation beams 80, 90. The first radiation beam 80, here having a wavelength $\lambda_1$ of approximately 1.3 μm, issues from a first side 50 of the laser 10 during operation, and the second radiation beam 90, with a greater wavelength $\lambda_2$, here a wavelength of approximately 1.5 μm, will enter the laser 10 at the first side 50 during operation. A diagrammatic cross-section of the laser 10 of FIG. 1 taken on the line II—II is given in FIG. 2, and a diagrammatic cross-section of the photodiode 20 of FIG. 1 taken on the line III—III is shown in FIG. 3.

The laser 10 (see FIG. 2) comprises a semiconductor body 10 with a substrate 1 of a first conductivity type, here the n-type, which is provided with a metal layer 8 and on which a semiconductor layer structure is present with an active layer 3 situated between two cladding layers 2, 4 and with a pn junction, in this case between the cladding layers 2 and 4 which are of the first, so n- and of a second, opposed, so p-conductivity type, respectively. Electromagnetic radiation can be generated within a strip-shaped active region 3A of the active layer 3 situated in a mesa 11A by means of the pn junction, given a sufficient current strength in the forward direction. A high-ohmic cladding layer 5 is present on either side of the mesa 11A. The width of the mesa 11A is approximately 2 μm and its length approximately 300 μm. The laser 10 here is of the so-called SIPBH (=Semi Insulating Planar Buried Hetero) type, and here further comprises a contact layer 6 which is also of the second, p-conductivity type. The cladding layers 2 and 4, which are approximately 1 μm thick, and the substrate comprise InP here. The active layer 3 has a thickness of approximately 0.15 μm and comprises InGaAsP, corresponding to an emission wavelength of approximately 1.3 μm. The active region 3A accordingly forms a radiation waveguide 3A for radiation having a wavelength of approximately 1.5 μm. The surfaces 50 and 60 were formed by cleaving and form a first mirror surface 50 and a second mirror surface 60.

The photodiode 20, which is present at a second side 60 of the laser 10 opposed to the first side 50 and of which the active region 26 (see FIG. 3) is aligned with the active region 3A of the laser 10, here comprises a substrate 21 which is provided with a metal layer 28 and which in this case is made of InP of the first, n-conductivity type, with an also n-type active InGaAs layer disposed thereon whose composition corresponds to a wavelength of approximately 1.6 μm and whose thickness is approximately 3 to 5 μm, and an approximately 1 μm thick top layer 23, also of n-InP in which a p-type zone 24 is present corresponding to the active region 26 and having a diameter of approximately 50 to 300 μm. On the upper surface 70 of the diode 20 there is an insulating layer 25, here of silicon dioxide, and a metal layer 27 which makes contact with the active region 26, below which a pn junction is formed between the layers 22 and 23, which junction is provided with a reverse bias voltage during operation and is sensitive to radiation of the second wavelength, i.e. 1.5 μm.

According to the invention, furthermore, the laser 10 and the photodiode 20 are provided with means 51, 61, 71 whereby during use the major portion of the emission of the laser 10 is formed by the first radiation beam 80, substantially exclusively the first radiation beam 80 issues from the first side 50 of the laser 10, and substantially the entire second radiation beam is capable of reaching the photodiode 20. As a result, the device according to the invention has the following highly surprising combination of properties. First, the radiation beam 80 has a substantially maximum emitted optical power. In addition, substantially no portion of the second radiation beam 90 returns into, for example, a glass fibre from which this beam originates, so that interfering reflections remain suppressed. Finally, the second radiation beam 90 can be detected with low losses and again without interfering reflections. A very important advantage of the device 100 according to the invention, finally, lies in the fact that the use of discrete components 10, 20 renders the manufacture of the device and of the components 10, 20 simple and cheap. The same goes for the means 51, 61, 71 according to the invention which may be fastened near, to or on the components 10, 20 in a simple manner.

The means 51, 61 here comprise a first coating 51 which is present at the first side 50 of the laser 10, and a second coating 61 which is present at the second side 60 of the laser 10. The first coating 51 has a low reflection for both wavelengths, here situated around 1.3 and 1.5 µm, whereas the second coating 61, a multilayer coating in this case, has a high reflection for the first wavelength and a low reflection for the second wavelength. In the present example, the coatings 51, 61 are provided on the mirror surfaces 50, 60 of the laser 10. The laser 10 here is a very simple Fabry-Pérot type laser 10 with a comparatively thick active layer 3, which is accordingly comparatively simple to manufacture. In this example, the means 51, 61, 71 also comprise a third multilayer coating 71 which is present on the photodiode 20 in this case and which has substantially the same properties as the second multilayer coating 61. As a result, the two coatings 61, 71 are comparatively simple, i.e. they comprise comparatively few layers, which is an important advantage. In fact, the laser 10 becomes hot during use, as a result of which the optical properties of the second multilayer coating 61 are affected, but such a coating 61 also flakes off sooner in proportion as it contains more layers. The temperature of the photodiode 20 does not change appreciably during use. In the present case, the two multilayer coatings 61, 71 are substantially identical, so that the manufacture of the device 100 remains simple.

Preferably, the first coating 51 has a reflection between 5 and 15% for the first wavelength, in this case a reflection of 9.7%, while it is low-reflecting or anti-reflecting for the second wavelength, here with a reflection of 2%. The multilayer coatings 61, 71 present at the second side 60 of the semiconductor diode laser 10 here have a reflection of between 99 and 100% for the first wavelength, in this case approximately 97.6% each, and are low-reflecting (preferably anti-reflecting) for the second wavelength, here each having a reflection of approximately 2.6%. In the present example, the first and second wavelength ($\lambda_1$, $\lambda_2$) lie between 1.28 µm and 1.34 µm, and between 1.48 µm and 1.60 µm, respectively. The first coating 51 applied to the first mirror surface 50 of the laser 10 here comprises one layer 51 of hafnium oxide with a thickness of 225 nm. The two multilayer coatings 61, 71 situated at the second side 60 of the laser 10 here each comprise eight layers of silicon dioxide and silicon, alternately, of which the first layer is 93.7 nm thick and the eighth layer 43.5 nm thick, while the second to seventh layers are 86.9 and 187.5 nm thick in alternation. This corresponds to a reflection at the first side 50 of the laser 10 of 9.7% for the 1.3 µm radiation and 2.0% for the 1.5 µm radiation. The reflection at each multilayer coating 61, 71 is then 97.6% for the 1.3 µm radiation and 2.6% for the 1.5 µm radiation.

In a first modification of this embodiment of the device 100, the photodiode 20 encloses an angle of, for example, 20° with the radiation path. This is to serve a monitor diode (not shown in the Figures) with which the power of the laser 10 can be controlled. In that case, only the thicknesses of the eight layers of the third coating 71 are adapted: the first layer is then 96.4 nm thick, the eighth layer 43.7 nm thick, and the second to seventh layer are alternately 87.5 and 192.9 nm thick. The reflection at the third multilayer coating 71 then is 93% for the 1.3 µm radiation and 3% for the 1.5 µm radiation.

In a modification of this embodiment of the device 100, the means according to the invention exclusively comprise a first coating 51, as described above, and a second coating 61. The second coating 61 then comprises ten layers alternating between silicon dioxide and silicon, of which the first layer is 93.7 nm thick, the tenth layer is 43.4 nm thick, and the second to ninth layers are alternately 86.9 and 187.5 nm thick. This corresponds to a reflection at the first side 50 of the laser 10 of approximately 9.7% for 1.3 µm radiation and 2.0% for 1.5 µm radiation. At the rear 60 of the laser 10 these values are 99.97% and 2.1%, respectively. This modification has, besides the disadvantage discussed above, the advantage that it is somewhat simpler.

Figure 4:
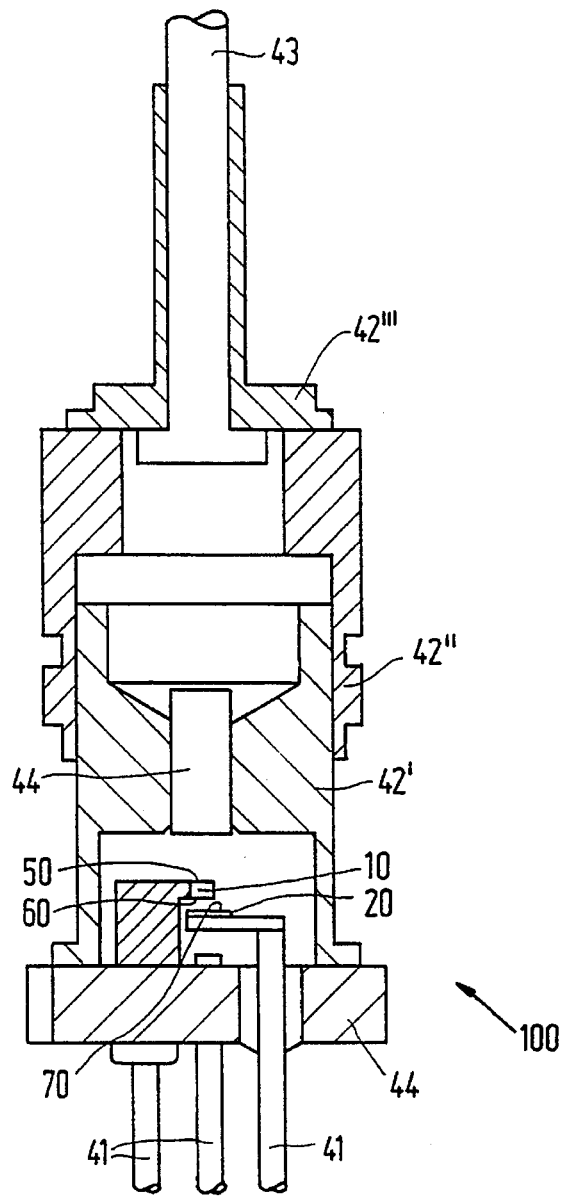
FIG. 4 diagrammatically shows the device of FIG. 1 in a coaxial sheath in longitudinal sectional view.

FIG. 4 diagrammatically shows the device 100 of FIG. 1 in a coaxial sheath in longitudinal sectional view. The device 100 is provided with electrical connections 41 for the laser 10, the photodiode 20, and a (semiconductor) monitor diode (if present, not shown in the Figure). The wire connections between the components 10, 20 and the connections 41 are not shown in the Figure. The module 100 is provided with further means 42 for coupling and uncoupling a glass fibre 43 aligned with the laser 10 at a side adjoining the first side 50 of the laser 10. The further means 42 here comprise a number of steel bushes 42', 42'', 42''' which can slide over and/or against one another in axial and/or radial direction and which are welded together, while one bush 42' here comprises a lens 44. Such a coaxial module can be manufactured comparatively easily and with high accuracy and contributes substantially to a low cost price of the device 100 according to the invention.

Figure 5:
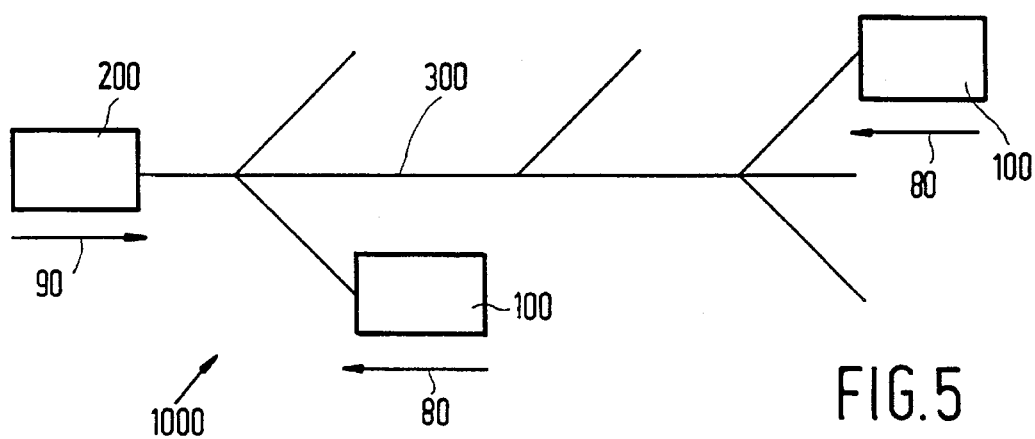
FIG. 5 diagrammatically shows a system for glass fibre communication comprising the device of FIG. 1.

FIG. 5 diagrammatically shows a system 1000 for glass fibre communication with the device 100 of FIG. 1. The system comprises an optoelectronic exchange 200 and, coupled thereto, a glass fibre network 300 which branches out and of which part of the ends is coupled to an optoelectronic transmitter/receiver unit 100 which is present at a subscriber's. The unit 100 sends a first radiation beam 80, here with a wavelength of 1.3 µm, to the exchange 200, which in its turn emits a second radiation beam 90, here with a wavelength of 1.5 µm, which is detected by the unit 100. The transceiver unit 100 comprises the optoelectronic semiconductor device of this embodiment.

The laser 10 of the device 100 in this embodiment, which at a first side 50 emits a radiation beam 80 with a first wavelength $\lambda_1$, and which forms a radiation waveguide 3 for a second radiation beam 90 with a second wavelength $\lambda_2$ greater than the first wavelength $\lambda_1$, is provided with means 51, 61 according to the invention whereby during use the major portion of the emission of the semiconductor diode laser 10 is formed by the first radiation beam 80, substantially exclusively the first radiation beam 80 issues from the first side 50, and whereby the second radiation beam 90 can pass through the semiconductor diode laser 10 substantially without losses. The laser 10 in this case has on its first mirror surface 50 a first coating 61 which has a low reflection at both wavelengths, while a second, multilayer coating 61 with a high reflection for the first wavelength and a low reflection for the second wavelength is present on a second mirror surface 60 of the laser 10 situated opposite the first mirror surface 50.

This embodiment of the device according to the invention is manufactured as follows (see FIGS. 1 and 4). First a large number of lasers 10 and photodiodes 20 are manufactured on separate substrates. The substrate carrying lasers 10 is cleaved into separate strips each comprising a row of lasers 10 situated next to one another whose mirror surfaces 50, 50 are situated in side surfaces of the strips. The material chosen for the active layer 3 in the manufacture of the laser 10 is InGaAsP, corresponding to an emission wavelength of 1.3μ, so that the active region 3A of the laser 10 can emit 1.3 μm radiation and forms a radiation waveguide 3A for 1.5 μm radiation. The material chosen for the active layer 22 in the manufacture of the photodiode 20 is InGaAs(P), here InGaAs, with a composition and thickness such that the photodiode 20 is sensitive to 1.5 μm radiation. According to the invention, subsequently, the strips containing lasers 10 and the substrate with photodiodes 20 are provided with means 51, 51, 71, by through sputtering here, as a result of which the major portion of the emission of the laser 10 is formed by the first radiation beam 80 during use, substantially exclusively the first radiation beam 80 issues from the first side 50 of the laser, and substantially the entire radiation beam 90 can reach the photodiode 20. The means 51, 61, 71 comprise the (multilayer) coatings mentioned above. After that, discrete lasers 10 and photodiodes 20 are obtained by cleaving and sawing, respectively, in this case. These discrete semiconductor components 10, 20 are then arranged one after the other in a single, straight radiation path through mounting on a suitable carrier 44, not shown in FIG. 1, but shown in FIG. 4, which is present within a box-shaped body 100 which is not shown in FIG. 1, but is shown in FIG. 4. In the case of a coaxial sheath 100 as depicted in FIG. 4, this sheath is provided with further means 42 for coupling or uncoupling of a glass fibre 43.

The invention is not limited to the embodiment given, since many modifications and variations are possible to those skilled in the art within the scope of the invention. Thus different thicknesses, different semiconductor materials, or different compositions may be used compared with those mentioned in the examples. It is especially noted that the invention may also be applied in the GaAs/AlGaAs and InGaP/InAlGaP material systems. It is also possible for the means to comprise besides coatings also other (external) provisions such as (external) gratings which, like coatings, may have different reflection/transmission properties at different wavelengths. The coatings may be present, instead of on the components, on plates, for example made of glass, which are arranged in the radiation path at the first and second sides of the laser and are included in the device. It is further noted that the invention may be used not only in the SIPBH structure described in the example, but also in an alternative structure such as the DCPBH (=Double Channel Planar Buried Hetero) structure. The invention may also be applied to great advantage in laser structures of the, possibly buried, ridge type. It is not even necessary for the active region to be formed fully or partly by a mesa. The invention can also be used to advantage in, for example, a so-called oxide strip laser.

I claim:

1. A optoelectronic semiconductor device (100) comprising a semiconductor diode laser (100) which at a first side (50) thereof emits a first radiation beam (80) with a first wavelength ($\lambda_1$) and which forms a radiation waveguide (3) for a second radiation beam (90) with a second wavelength ($\lambda_2$) greater than the first wavelength ($\lambda_1$), which second beam (90) can enter the semiconductor diode laser (10) at the first side (50), and a semiconductor photodiode (20) which is present at a second side (60) of the semiconductor diode laser (10) opposed to the first side (50), which is aligned relative to the semiconductor diode laser (10), and which is sensitive to radiation of the second wavelength ($\lambda_2$), characterized in that the semiconductor diode laser (10) and the semiconductor photodiode (20) are discrete semiconductor components which are provided in series along a single straight radiation path, and the semiconductor device (100) is provided with coating means (51, 61, 71) whereby during use the major portion of the emission of the semiconductor diode laser (10) is formed by the first radiation beam (80), substantially exclusively the first radiation beam (80) issues from the first side (50) of the semiconductor diode laser (10), and substantially the entire second radiation beam (90) is capable of reaching the semiconductor photodiode (20).

2. An optoelectronic semiconductor device (100) as claimed in claim 1, characterized in that said coating means (51,61) comprises in that order a first coating (51) which is present at the first side (50) of the semiconductor diode laser (10) and which has a low reflection at both wavelengths, and a second coating (61) which is present at the second side (60) of the semiconductor diode laser (10) and which has a high reflection at the first wavelength and a low reflection at the second wavelength.

3. An optoelectronic semiconductor device (100) as claimed in claim 2, characterized in that the first coating (51) comprises a single-layer coating (51) and the second coating (61) comprises a multilayer coating (61).

4. An optoelectronic semiconductor device (100) as claimed in claim 2, characterized in that the semiconductor diode laser (10) is of the Fabry-Pérot type and the first coating (51) is present on a first mirror surface (50) of the semiconductor diode laser (10) situated at the first side (50), and the second, multilayer coating (61) is present on a second mirror surface (60) of the semiconductor diode laser (10) situated at the second side (60).

5. An optoelectronic semiconductor device (100) as claimed in claim 3, characterized in that the coating means (51, 61, 71) comprises a third multilayer coating (71) which is present on a side (70) of the semiconductor photodiode (20) facing the semiconductor diode laser (10), and which has properties similar to those of the second, multilayer coating (61).

6. An optoelectronic semiconductor device (100) as claimed in claim 5, characterized in that the second and the third multilayer coatings (61,71) are substantially identical.

7. An optoelectronic semiconductor device (100) as claimed in claim 5, characterized in that the semiconductor photodiode (20) is arranged at a small angle of between approximately 10 and 30 degrees relative to the radiation path, and the optoelectronic semiconductor device (100) also comprises a semiconductor monitor diode (30) which is sensitive to radiation of the first wavelength ($\lambda_1$) and which is aligned relative to the radiation reflected by the semiconductor photodiode (20).

8. An optoelectronic semiconductor device (100) as claimed in claim 5, characterized in that the first coating (51) has a reflection of between 5 and 15% at the first wavelength and is one of low-reflecting and anti-reflecting at the second wavelength, and the second and third multilayer coatings (61,71) present at the second side (60) of the semiconductor diode laser (10) together have a reflection of between approximately 99 and 100% at the first wavelength and are one of low-reflecting and anti-reflecting at the second wavelength.

9. An optoelectronic semiconductor device (100) as claimed in claim 8, characterized in that the multilayer coatings (61,71) present at the second side (60) of the semiconductor diode laser (10) together have a reflection of between 99.9% and 99.99% at the first wavelength.

10. An optoelectronic semiconductor device (100) as claimed in claim 1, characterized in that the first wavelength lies between 1.28 μm and 1.34 μm, and the second wavelength lies between 1.48 μm and 1.60 μm.

11. An optoelectronic semiconductor device (100) as claimed in claim 10, characterized in that a first coating present at a first side (50) of the semiconductor diode laser (10) comprises one hafnium oxide layer (51) with a thickness of 226 nm, and a second, multilayer coating (61) situated at a second side (60) opposed to the first side (50) comprises ten layers of silicon dioxide and silicon alternately, of which the first layer is 93.7 nm thick, the tenth layer 43.4 nm thick, and the second to ninth layers are 86.9 and 187.5 nm thick alternately.

12. An optoelectronic semiconductor device (100) as claimed in claim 10, characterized in that a first coating (51) which is present at a first side (50) of the semiconductor diode laser (10) comprises one layer (51) of hafnium oxide with a thickness of 225 nm, and two multilayer coatings (61, 71) which are situated at a second side (60) of the semiconductor diode laser (10) opposed to the first side (50) and of which one (61) is arranged on the semiconductor diode laser (10) and one (71) on the semiconductor photodiode (20), each comprising eight layers of silicon dioxide alternating with silicon, of which the first layer is 93.7 nm thick and the eighth layer 43.5 nm thick, while the second to seventh layers are alternately 86.9 and 187.5 nm thick.

13. An optoelectronic semiconductor device (100) as claimed in claim 10, characterized in that a first coating (51), which is present at a first side (50) of the semiconductor diode laser (10), comprises one layer (51) of hafnium oxide with a thickness of 225 nm, a second, multilayer coating (61) which is situated at a side (60) of the semiconductor diode laser (10) opposed to the first side (50) and which is provided on the semiconductor diode laser (10), comprises eight layers of silicon dioxide alternating with silicon, of which the first layer is 93.7 nm thick and the eighth layer is 43.5 nm thick, and the second to seventh layers are alternately 86.9 and 187.5 nm thick, and a third, multilayer coating (71) present on the semiconductor photodiode (20) also comprises eight layers of silicon dioxide alternating with silicon, of which the thickness of the first layer is 96.4 nm, the thickness of the eighth layer 43.7 nm, and the second to seventh layers are alternately 87.5 and 192.9 nm thick.

14. An optoelectronic semiconductor device (100) as claimed in claim 1, characterized in that the device comprises a box-shaped body (100) within which the semiconductor components (10,20) are present and which is provided with electrical connections (41) for the semiconductor components (10,20) and with further means (42) for coupling and uncoupling a glass fibre (43) aligned with the semiconductor diode laser (10) at a side adjoining the first side (50) of the laser (10).

15. An optoelectronic semiconductor device (100) as claimed in claim 14, characterized in that the box-shaped body (100) comprises a coaxial sheath.

16. A system for optical glass fibre communication with an optoelectronic exchange (200) and coupled thereto a glass fibre network (300) which branches out and of which part of the ends is coupled to an optoelectronic transmitter/receiver unit (100) which is present at a subscriber characterized in that the transmitter/receiver unit (100) comprises an optoelectronic semiconductor device (100) as claimed in claim 1.

17. A semiconductor diode laser (10) as claimed in claim 15, characterized in that a first coating (51) is present on a first mirror surface (50) of the semiconductor diode laser (10) which has a low reflection at both wavelengths, while a second coating (61) having a high reflection at the first wavelength and a low reflection at the second wavelength is present on a second mirror surface (60) of the semiconductor diode laser (10).

18. A semiconductor diode laser (10) which emits a radiation beam (80) at a first side (50) thereof with a first wavelength ($\lambda_1$) and which forms a radiation waveguide (3) for a second radiation beam (90) with a second wavelength ($\lambda_2$) greater than the first wavelength ($\lambda_1$), characterized in that the semiconductor diode laser (10) is provided with coating means (51,61) whereby during use the major portion of the emission of the semiconductor diode laser (10) is formed by the first radiation beam (80), substantially exclusively the first radiation beam (80) issues from the first side (50), and whereby the second radiation beam (90) can pass through the semiconductor diode laser (10) substantially without losses.

19. A method of manufacturing an optoelectronic semiconductor device (100) comprising a semiconductor diode laser (10) which emits a first radiation beam (80) with a first wavelength ($\lambda_1$) at a first side (50) and which forms a radiation waveguide (3) for a second radiation beam (90) with a second wavelength ($\lambda_2$) greater than the first wavelength ($\lambda_1$) and capable of entering the semiconductor diode laser (10) at the first side (50), and which comprises a semiconductor photodiode (20) present at a second side of the semiconductor diode laser (10) opposed to the first side (50), aligned with the semiconductor diode laser (10), and sensitive to radiation with the second wavelength ($\lambda_2$), said method comprising the steps of choosing discrete semiconductor components for the semiconductor diode laser (10) and the semiconductor photodiode (20), arranging said laser (10) and said photodiode (20) in a single, rectilinear radiation path one after the other, providing said laser (10) and said photodiode (20) with coating means (51,61,71) and during use forming the major portion of the emission of the semiconductor diode laser by the first radiation beam (80), issuing the first radiation beam (80) substantially exclusively from the first side (50) of the semiconductor diode laser (10), and permitting substantially the entire the second radiation beam (90) to reach the semiconductor photodiode (20).

* * * * *